United States Patent
Hu et al.

(10) Patent No.: US 11,736,867 B2
(45) Date of Patent: Aug. 22, 2023

(54) ACTIVE MICROPHONE FOR INCREASED DAS ACOUSTIC SENSING CAPABILITY

(71) Applicant: NEC Laboratories America, Inc., Princeton, NJ (US)

(72) Inventors: Junqiang Hu, Davis, CA (US); Ting Wang, West Windsor, NJ (US)

(73) Assignee: NEC Corporation

( * ) Notice: Subject to any disclaimer, the term of this patent is extended or adjusted under 35 U.S.C. 154(b) by 0 days.

(21) Appl. No.: 17/579,516

(22) Filed: Jan. 19, 2022

(65) Prior Publication Data
US 2022/0279287 A1 Sep. 1, 2022

Related U.S. Application Data

(60) Provisional application No. 63/139,380, filed on Jan. 20, 2021.

(51) Int. Cl.
| | |
|---|---|
| H04R 23/00 | (2006.01) |
| G01H 9/00 | (2006.01) |
| H03G 3/30 | (2006.01) |
| H04R 1/08 | (2006.01) |
| H04R 3/00 | (2006.01) |

(52) U.S. Cl.
CPC ........... *H04R 23/008* (2013.01); *G01H 9/004* (2013.01); *H03G 3/3005* (2013.01); *H04R 1/08* (2013.01); *H04R 3/00* (2013.01); *H03G 2201/103* (2013.01); *H04R 2430/01* (2013.01)

(58) Field of Classification Search
CPC .......... G01H 9/004; H03G 3/3005; H03G 2201/103; H03G 3/32; H04R 23/008; H04R 1/08; H04R 3/00; H04R 2430/01
USPC ...................................... 381/57, 91, 92, 122
See application file for complete search history.

(56) References Cited

U.S. PATENT DOCUMENTS

| | | | | |
|---|---|---|---|---|
| 4,297,887 | A * | 11/1981 | Bucaro | G01H 9/004 367/140 |
| 6,229,762 | B1 * | 5/2001 | Fisher | H04R 23/008 367/149 |
| 11,054,303 | B2 * | 7/2021 | Hu | G01D 5/35361 |
| 11,428,570 | B2 * | 8/2022 | Tian | G02B 6/483 |
| 11,467,061 | B2 * | 10/2022 | Yaman | G01H 9/004 |
| 2018/0222498 | A1 * | 8/2018 | Kelley | B61L 1/06 |
| 2018/0245971 | A1 * | 8/2018 | Suh | G01V 1/226 |
| 2020/0158594 | A1 | 5/2020 | Dankers et al. | |
| 2020/0226895 | A1 | 7/2020 | Masters | |
| 2022/0065977 | A1 * | 3/2022 | Ozharar | G01S 3/8083 |
| 2022/0196461 | A1 * | 6/2022 | Hu | G01H 9/004 |

* cited by examiner

*Primary Examiner* — Xu Mei
(74) *Attorney, Agent, or Firm* — Joseph Kolodka

(57) ABSTRACT

Aspects of the present disclosure describe DFOS/DAS systems, methods, and structures that employ active microphones to enhance DAS operational capabilities by using an active circuit to amplify acoustic signals including voice(s). The circuit includes a microphone to collect acoustic signal (s) resulting from voice signals in the environment, and a speaker or a vibration device driven by an amplifier. The circuit can be clipped onto the fiber, with direct contact through the speaker or vibration device. A microcontroller may advantageously be employed to control the circuit for reduced power consumption, by detecting activities locally and only enabling the speaker when needed. The microcontroller may also send other information such as battery status to the DFOS interrogator through vibration codes.

9 Claims, 6 Drawing Sheets

ACTIVE MICROPHONE FOR INCREASED DAS ACOUSTIC SENSING CAPABILITY

CROSS REFERENCE TO RELATED APPLICATIONS

This application claims the benefit of U.S. Provisional Patent Application Ser. No. 63/139,380 filed 20 Jan. 2021 the entire contents of which is incorporated by reference as if set forth at length herein.

TECHNICAL FIELD

This disclosure relates generally to distributed fiber optic sensing (DFOS). More particularly, it pertains to the use of an active microphone for increased distributed acoustic sensing (DAS) capability.

BACKGROUND

As will be understood by those skilled in the art, (DFOS) systems and techniques have been employed in numerous applications as they can sense vibration signals and/or acoustic signals in the vicinity of fiber optic cables and generate time-stamped data streams of sensed signals thereby providing valuable information to decision makers. Given this importance, techniques and or structures that enhance the capabilities of DFOS/DAS would represent a welcome addition to the art.

SUMMARY

An advance in the art is made according to aspects of the present disclosure directed to DFOS/DAS systems, methods, and structures that advantageously find application in a wide variety of sensing applications. In sharp contrast to the prior art, DFOS/DAS systems, methods, and structures according to aspects of the present disclosure employ active microphones to enhance DAS operational capabilities.

Viewed from a certain aspect, our inventive approach enhances DFOS/DAS systems by using an active circuit to amplify acoustic signals—including voices. The circuit includes a microphone to collect acoustic signal(s) in the environment, and a speaker or a vibration device driven by an amplifier. The circuit can be clipped onto the fiber, with direct contact through the speaker or vibration device. A microcontroller may advantageously be employed to control the circuit for reduced power consumption, by detecting activities locally and only enabling the speaker when needed. The microcontroller may also send other information such as battery status to the DFOS interrogator through vibration codes.

BRIEF DESCRIPTION OF THE DRAWING

A more complete understanding of the present disclosure may be realized by reference to the accompanying drawing in which.

Figure 1:
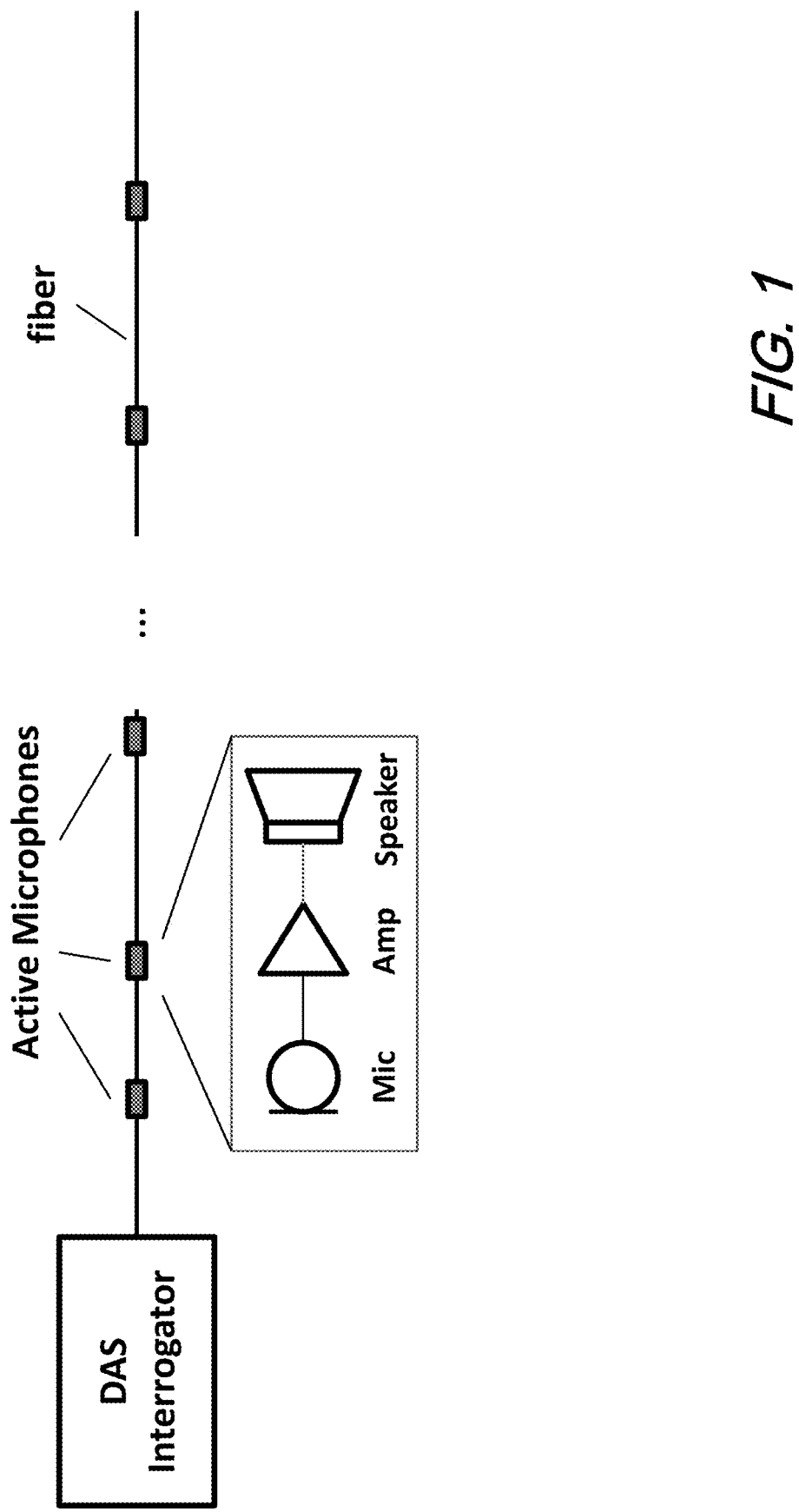
FIG. 1 is a schematic diagram of an illustrative arrangement according to aspects of the present disclosure.

The illustrative embodiments are described more fully by the Figures and detailed description. Embodiments according to this disclosure may, however, be embodied in various forms and are not limited to specific or illustrative embodiments described in the drawing and detailed description.

DESCRIPTION

The following merely illustrates the principles of the disclosure. It will thus be appreciated that those skilled in the art will be able to devise various arrangements which, although not explicitly described or shown herein, embody the principles of the disclosure and are included within its spirit and scope.

Furthermore, all examples and conditional language recited herein are intended to be only for pedagogical purposes to aid the reader in understanding the principles of the disclosure and the concepts contributed by the inventor(s) to furthering the art and are to be construed as being without limitation to such specifically recited examples and conditions.

Moreover, all statements herein reciting principles, aspects, and embodiments of the disclosure, as well as specific examples thereof, are intended to encompass both structural and functional equivalents thereof. Additionally, it is intended that such equivalents include both currently known equivalents as well as equivalents developed in the future, i.e., any elements developed that perform the same function, regardless of structure.

Thus, for example, it will be appreciated by those skilled in the art that any block diagrams herein represent conceptual views of illustrative circuitry embodying the principles of the disclosure.

Unless otherwise explicitly specified herein, the FIGS. comprising the drawing are not drawn to scale.

By way of some additional background—we again note that in recent years, distributed fiber optic sensing (DFOS) systems including distributed vibration sensing (DVS) and distributed acoustic sensing (DAS) have found widespread acceptance in numerous applications including—but not limited to—infrastructure monitoring, intrusion detection, and earthquake detection.

Those skilled in the art will understand and appreciate that Rayleigh backscattering distributed fiber optic sensing advantageously can perform simultaneous detection of activities occurring at any location along the length of the sensing fiber. Such operation can detect both voice frequency(ies) and even ultra-sonic frequency(ies), depending on the fiber length. This characteristic is advantageously employed to detect acoustic signals along the fiber length. In prior art, there are several reported solutions to collect acoustic signals, such as using linear fiber to detect the acoustic signals directly or using a fiber coil to enhance vibrations resulting from acoustic events. However, linear fiber has very weak response to voice signals, while a fiber coil requires special handling in fiber fabrication or layout, and sacrifices the sensing reach.

As we shall show and describe systems, methods, and structures according to aspects of the present disclosure employ an active circuit to amplify voice signals such that they may be reliably and reproducibly detected using DOFS.

An illustrative active circuit according to the present disclosure includes a microphone to collect acoustic signals in the environment, and a speaker or a vibration device driven by an amplifier.

Advantageously, such a circuit can be clipped onto a fiber optic sensing fiber, with direct contact through the speaker or vibration device. In an illustrative embodiment, a microcontroller is employed to control the circuit for reduced power consumption, by detecting activities locally and only enabling the output speaker when required. The microcontroller may also send other information such as battery status to the interrogator through vibration signals.

As we shall show and describe, our inventive disclosure describes systems, methods, and structures that enhance DFOS/DAS operation through the use of microphone(s), amplifier(s), and speaker(s) to sense/amplify/transfer voice vibration signals to a sensing fiber optic. Mechanical vibration produced from the speaker are directed to the sensing fiber optic as a result of its direct contact with the fiber which advantageously results in reproduceable DFOS/clear receiving of the voice signal at the interrogator. Advantageously, a microcontroller may be employed to turn on the speaker only when a voice signal is detected, thereby providing a low power operation. Finally, such microcontroller may be advantageously configured to report circuit status or other information to a DFOS interrogator for analysis and action.

As noted, aspects of the present disclosure are directed to distributed fiber optic sensing systems, methods, and structures that advantageously recover acoustic signals for any locations simultaneously along a sensing fiber optic. It includes an interrogator that actively sends "probe" signals into an optically coupled sensing fiber, and processes reflected/back scattered signals received from the fiber.

In one illustrative embodiment, Rayleigh backscattering may be employed for distributed acoustic sensing (DAS), using either direct detection or coherent detection. The signal from the fiber has environmental information from all its travelling locations, in particular the vibration or acoustic information. The DAS interrogator processes the received signal to extract vibration signals for each location along the fiber up to the pulse or code repetition rate, which represent the "sampled" acoustic signal, to either playback or for further processing.

FIG. 1 is a schematic diagram of an illustrative arrangement according to aspects of the present disclosure. As may be observed from this figure, such illustrative arrangement includes a DAS interrogator, its optically coupled sensing fiber, and active microphones. In an illustrative embodiment, an active microphone may include one or more microphones, amplifiers, and speakers, as application needs dictate. Operationally, the microphone receives an acoustic signal from the environment, amplifies it through the effect of the amplifier, and outputs a representative signal to drive the speaker. In a preferred embodiment, the speaker or the packaged device has a direct contact to the fiber optic cable, to mechanically stimulate its point of attachment to the fiber using the amplified output acoustic signal. Once the fiber optic cable is so stimulated, the mechanical/vibratory signals produced in the sensor fiber optic cable is detected by the interrogator using an acoustic sensing scheme.

Active Microphone

Figure 2A:
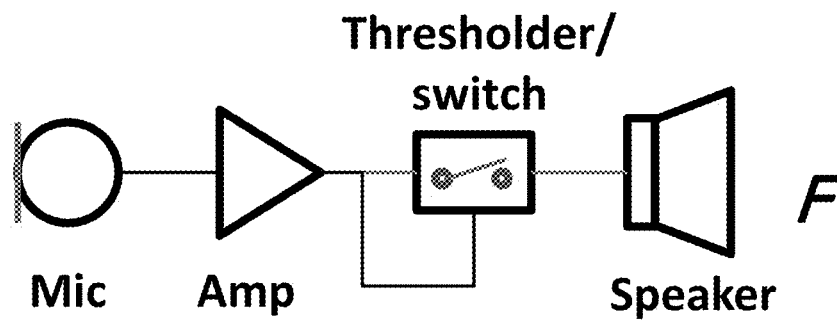
FIG. 2(A), FIG. 2(B), and FIG. 2(C) show illustrative thresholder(s) to enable/disable a speaker according to aspects of the present disclosure.
Figure 2B:
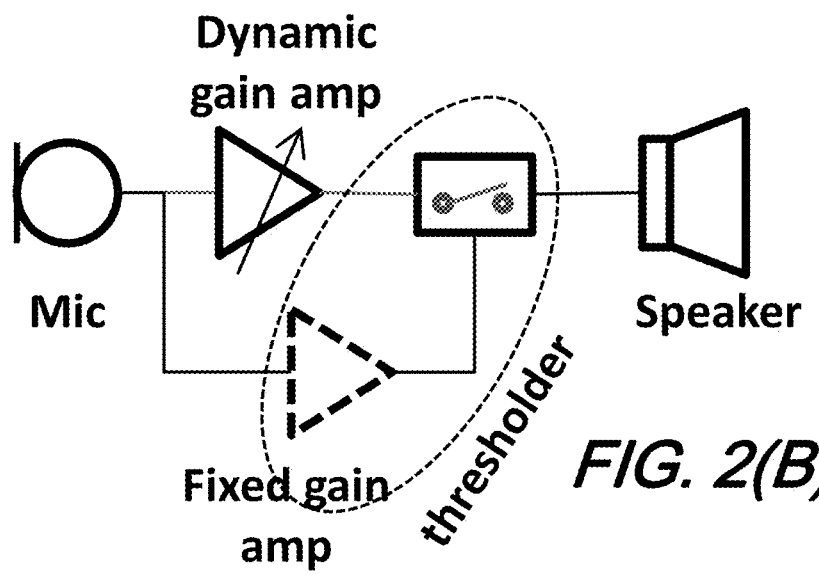
Figure 2C:
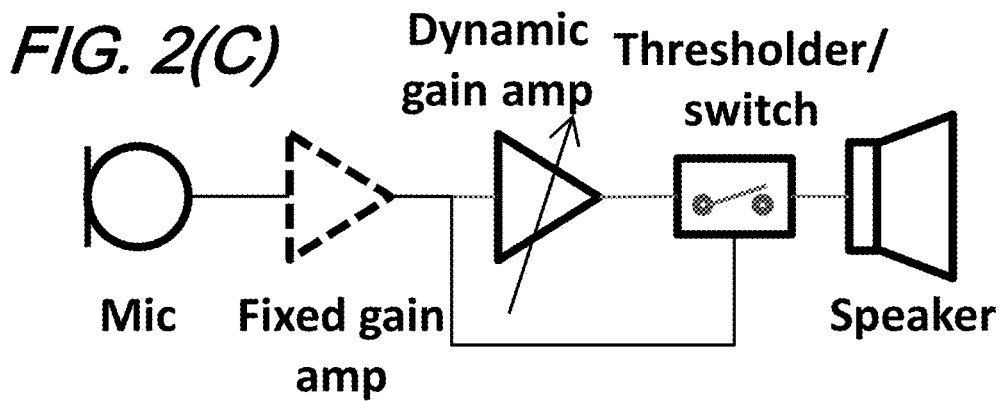

To reduce power consumption, the active microphone may include a thresholder circuit such that the speaker is driven only when a detected environmental signal (i.e., a voice or other sound) is larger than the threshold. In one embodiment, the thresholder circuit is controlled by signal from fixed amplifier output, driving a mechanical switch or a transistor. When the signal is larger than the threshold, the mechanical switch or the transistor turns on, so the speaker is activated, and acoustic signals are output from the speaker and directed to the sensor fiber. In one illustrative embodiment, the speaker may be driven by a dynamic gain amplifier, to increase detected signal range. FIG. 2(A), FIG. 2(B), and FIG. 2(C) show illustrative thresholder(s) to enable/disable a speaker according to aspects of the present disclosure.

In one illustrative embodiment, the active microphone includes a microcontroller unit (MCU). The MCU controls on/off operation of the speaker based on environmental signal level. The MCU may work in low power or hibernating mode, while still able to detect interrupts. The microphone output or its amplified signal passes through thresholder logic, to generate an interrupt signal and wakeup the MCU when the detected acoustic signal level is higher than a pre-determined threshold.

Figure 3A:
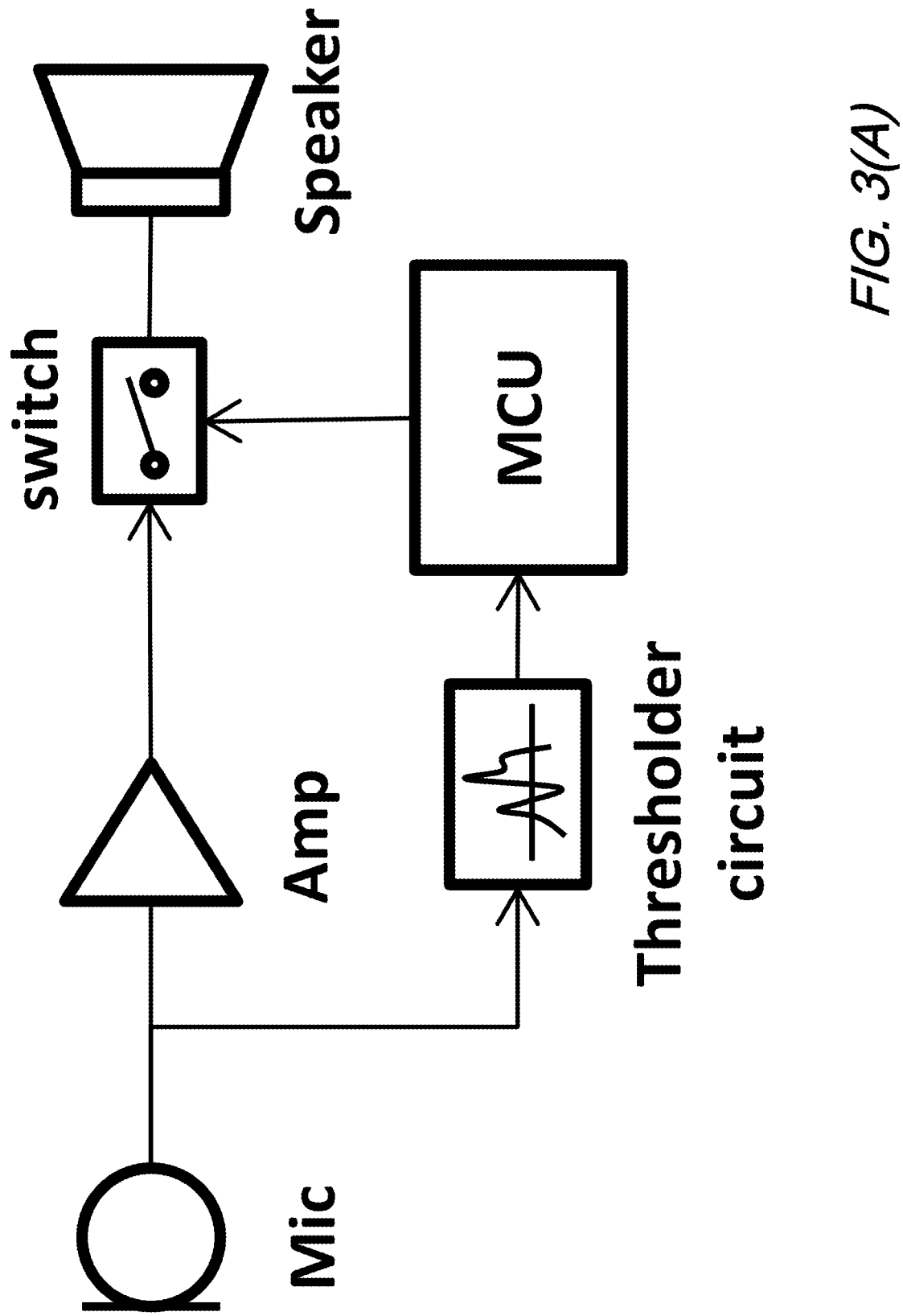
FIG. 3(A), and FIG. 3(B) show a schematic of an illustrative on/off switch controlled by MCU and a flow diagram illustrating operation respectively, according to aspects of the present disclosure.
Figure 3B:
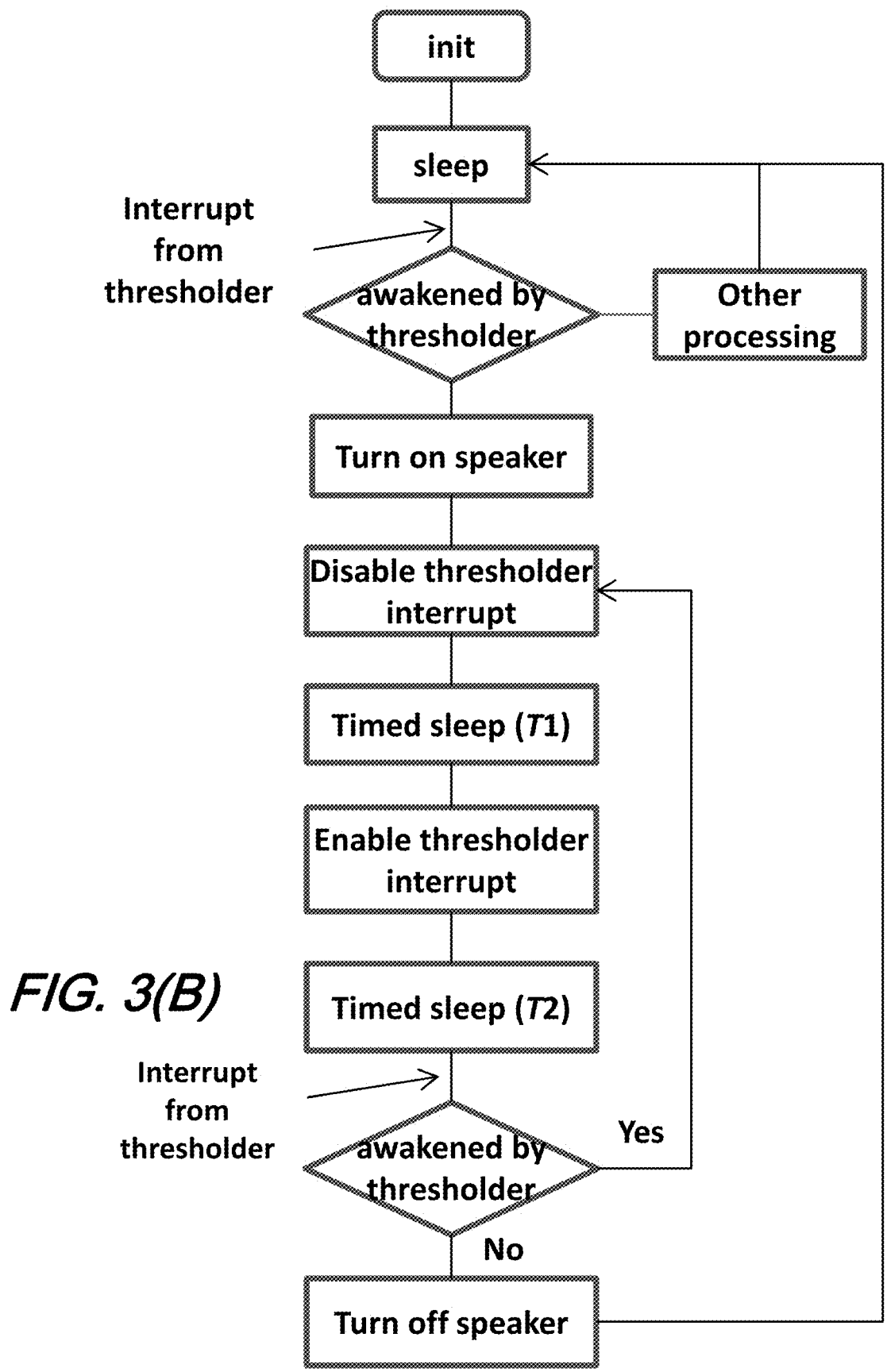

Turning now to FIG. 3(A), and FIG. 3(B) which show a schematic of an illustrative on/off switch controlled by MCU and a flow diagram illustrating operation respectively, according to aspects of the present disclosure, it may be observed that the MCU configures the speaker's driving circuit to turn the speaker on, as shown in the figure. Once the speaker is turned on, it will remain on for a time period (T1), during which the MCU may be put into a sleep/low-power mode. When T1 expires, it enables interrupt from a thresholder, and enters another timed sleep mode (for up to T2). During this period, if an interrupt from the thresholder is detected, it indicates that an environmental signal is still detectable, so the speaker will remain on and the MCU returns to sleep mode of T1; otherwise, there is no detectable signal, so the speaker is turned off and a initial sleep mode. Note that with a dynamic gain amplifier, the gain can be controlled by the MCU as well.

Figure 4:
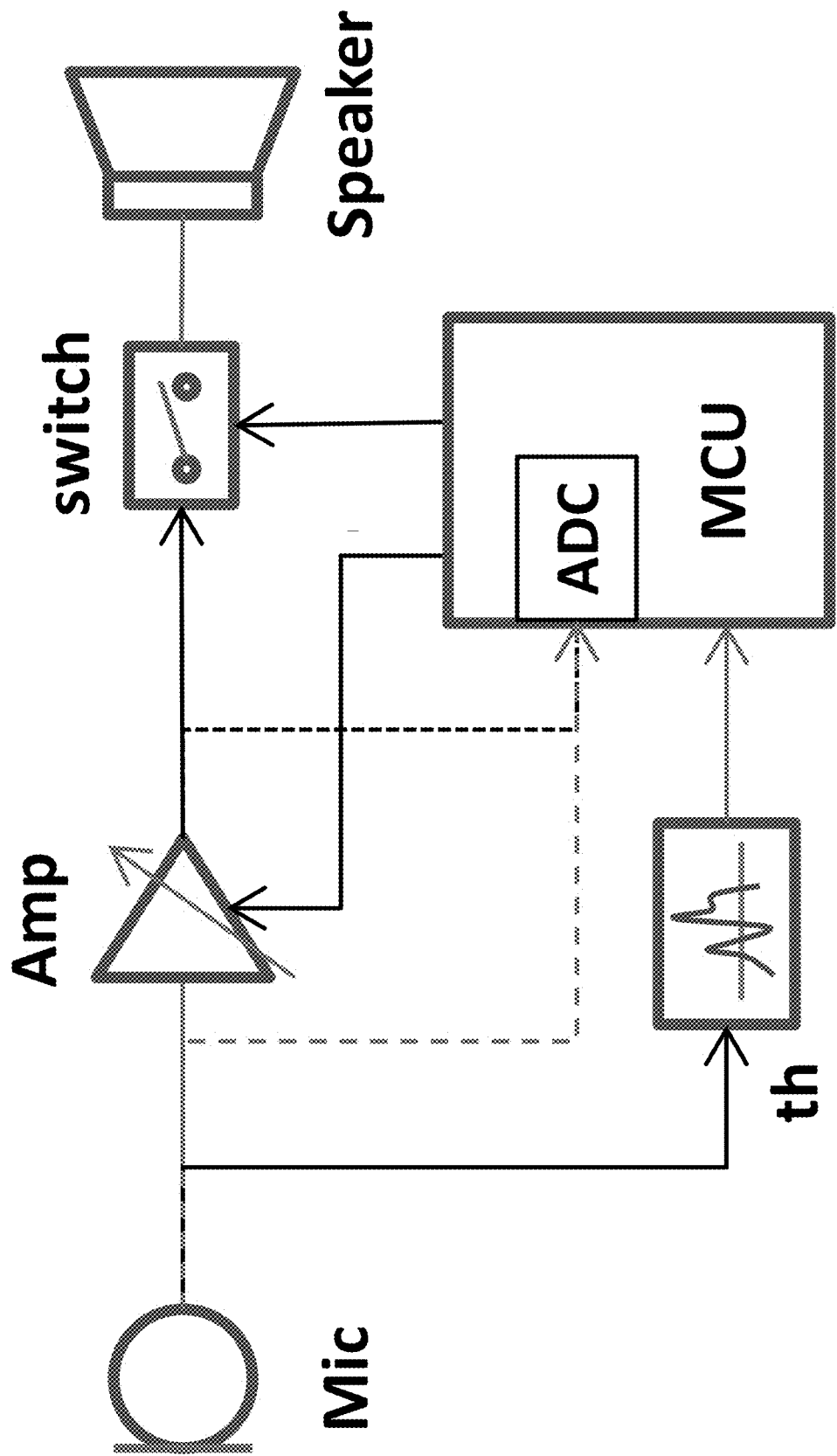
FIG. 4 is a schematic diagram illustrating MCU controlling amplifier gain using ADC data according to aspects of the present disclosure.

FIG. 4 is a schematic diagram illustrating MCU controlling amplifier gain using ADC data according to aspects of the present disclosure. In one illustrative example, as shown in the figure, the MCU employs an ADC (analog-to-digital converter) to sample the input or the amplified signal, to determine gain. With further reference to the flow diagram of FIG. 3(B), the MCU may get the ADC sampled value when awakened by thresholder interrupt, or after timed sleep T1, and the timed sleep period T1 and T2 referenced in FIG. 3(B) can be replaced by multiple sleeps of reduced length, to control the gain in finer time intervals.

Figure 5:
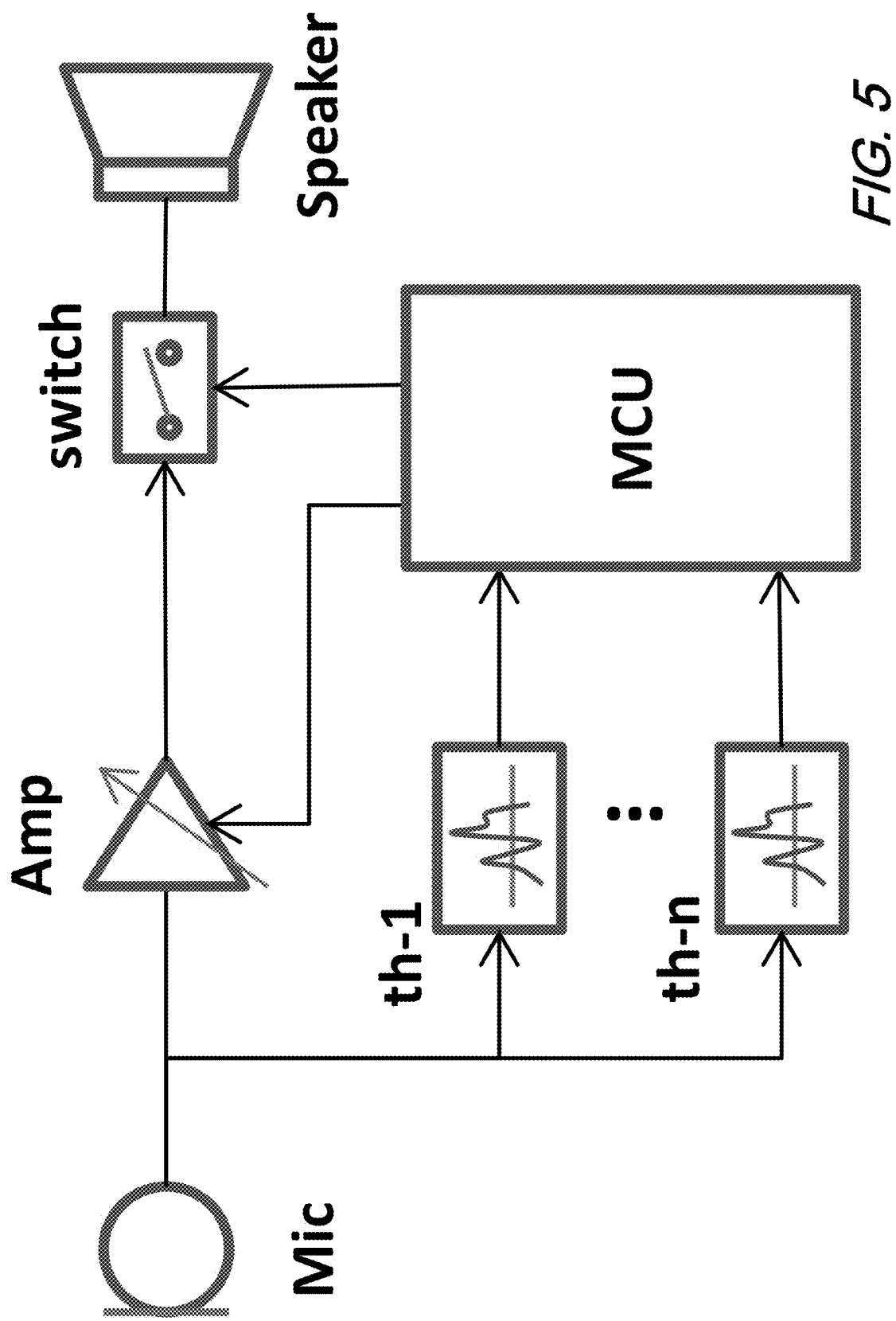
FIG. 5 is a schematic diagram illustrating MCU controlling amplifier gain using multiple thresholders according to aspects of the present disclosure.

Advantageously, the MCU may use multiple thresholders for amplifier gain control, as shown illustratively in FIG. 5, which is a schematic diagram illustrating MCU controlling amplifier gain using multiple thresholders according to aspects of the present disclosure.

Assume $th\text{-}1 < th\text{-}2 < \ldots < th\text{-}n$. Initially, the MCU enables interrupt from thresholder th-1 and enters sleep mode. Once the MCU is awakened by the interrupt, it turns on the speaker and set the amplifier gain to maximum. At the same time, it enables higher threshold interrupt which is th-2. When interrupt from th-2 is detected, the MCU sets the corresponding gain and enables a next higher level interrupt. This operation continues until no interrupt can be detected or the highest threshold level is enabled.

In each gain level corresponding to thresholder th-i, the interrupt of both th-i and th-(i+1) (if i<n) are enabled. For configured time period, if no interrupt from th-i is detected, the MCU enters gain level th-(i−1), or turns off the speaker and goes to sleep if i=1.

In one implementation, in gain level th-i, interrupts of both th-1, th-i, and th-(i+1) are enabled, with time out period of T1 and T2 (T1<T2), in that in T1 period, if th-(i+1) is detected, enter gain level th-(i+1); if no interrupt from th-i, enter th-(i−1); for time period T2, if no interrupt from th-1 detected, the MCU turns off the speaker and goes to sleep. That is, in time period T1, if the detected signal is higher than th-(i+1), enter th-(i+1) gain level; if lower than th-i, enter th-(i−1) level; in time period T2, if lower than th-1, go to sleep mode.

Alternatively, the MCU uses fixed time interval T1, and may change the gain only once during each time interval. After the speaker is turned on, the MCU enables all the interrupts from th-1 to th-n. At the end of each time interval, it checks which maximum threshold has reached, and tune the gain to that threshold level. If the detected signal is lower than th-1 for T2 period, it turns off speaker and goes to sleep Microphone Status Report For a configuration in which an MCU is employed for its control/monitoring, and the speaker is used to generate/regenerate acoustic signals, the active microphone may send embedded status reports to the interrogator. In one example scenario, the MCU sends the active microphone status information and processed environmental information to the interrogator. Operationally, the MCU modulates the information into an acoustic signal, drives the speaker, and conveys it to the interrogator by stimulating the fiber through the effect of the speaker output. The MCU-generated signal can be overlaid with a detected/regenerated signal, or alone by temporarily turning off the regeneration path thereby enabling status reports only. The sending information may include the microphone's working condition, such as battery status etc., and/or it may include an "active" report, which notifies the interrogator that the device is in normal working condition. Advantageously, the conveyed information may also include gain setting or other operational parameters, to inform/allow the interrogator to determine an actual acoustic signal level.

At this point, while we have presented this disclosure using some specific examples, those skilled in the art will recognize that our teachings are not so limited. Accordingly, this disclosure should be only limited by the scope of the claims attached hereto.

The invention claimed is:

1. A distributed fiber optic sensing (DFOS)/distributed acoustic sensing (DAS) system comprising:
 a length of optical sensing fiber;
 a DFOS/DAS interrogator in optical communication with the length of optical sensing fiber; and
 one or more active microphone nodes in physical contact with the length of optical sensing fiber;
 wherein the one or more active microphone nodes includes a microphone that converts environmental sound(s) into electrical signals, an amplifier that increases the power of the electrical signals, and a speaker that converts the amplified signals into a corresponding sound, said one or more active microphone nodes configured to direct any sound produced by the speaker(s) to the optical sensing fiber.

2. The DFOS/DAS system of claim 1 wherein the one or more active microphone nodes includes a thresholder configured to apply power to the active microphone node speaker when an environmental sound electrical signal exceeds a pre-determined threshold.

3. The DFOS/DAS system of claim 1 further comprising a microcontroller (MCU) configured to apply power to the active microphone node speaker when an environmental sound electrical signal exceeds a pre-determined threshold.

4. The DFOS/DAS system of claim 3 wherein the MCU includes an analog-to-digital converter configured to determine an amplitude of the environmental sound electrical signal and adjust a gain of the amplifier in response to that determined amplitude.

5. The DFOS/DAS system of claim 4 wherein the one or more active microphone nodes includes one or more thresholder circuits configured to apply an interrupt signal to the MCU when an environmental sound electrical signal meets a pre-determined threshold, the MCU configured to adjust a gain of the amplifier upon receipt of the interrupt(s).

6. The DFOS/DAS system of claim 5 wherein the MCU is configured to remove power from the speaker when a environmental sound electrical signal is lower than a pre-determined threshold for a predetermined period of time.

7. The DFOS/DAS system of claim 3 wherein the MCU is configured to encode node status information into an acoustic signal through the effect of the speaker and drives the speaker to relay the status information to the interrogator.

8. The DFOS/DAS system of claim 7 wherein the status information includes amplifier gain level.

9. The DFOS/DAS system of claim 7 wherein the status information includes battery status.

* * * * *